(12) United States Patent
Aroca et al.

(10) Patent No.: US 7,876,155 B2
(45) Date of Patent: Jan. 25, 2011

(54) TRANSIMPEDANCE AMPLIFIER WITH DISTRIBUTED CONTROL OF FEEDBACK LINE

(75) Inventors: Ricardo Andres Aroca, Toronto (CA); Young-Kai Chen, Berkeley Heights, NJ (US); Jaesik Lee, Bridgewater, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 12/454,326

(22) Filed: May 16, 2009

(65) Prior Publication Data

US 2010/0289584 A1 Nov. 18, 2010

(51) Int. Cl.
H03F 3/45 (2006.01)

(52) U.S. Cl. .................... 330/260; 330/308

(58) Field of Classification Search .......... 330/260, 330/308, 69
See application file for complete search history.

(56) References Cited

U.S. PATENT DOCUMENTS

| | | | | |
|---|---|---|---|---|
| 5,602,511 A | * | 2/1997 | Woolaway | 330/282 |
| 6,956,439 B1 | * | 10/2005 | Devnath | 330/308 |
| 7,495,944 B2 | * | 2/2009 | Parkinson et al. | 365/148 |
| 7,579,915 B2 | * | 8/2009 | Tatsumi et al. | 330/308 |
| 2007/0036555 A1 | | 2/2007 | Chen et al. | 398/188 |
| 2007/0071456 A1 | | 3/2007 | Chen et al. | 398/204 |
| 2008/0152361 A1 | | 6/2008 | Chen et al. | 398/205 |

OTHER PUBLICATIONS

"Current-to-voltage converter" published on line at: http://en.wikipedia.org/wiki/Current-to-voltage_conerter, From Wikipedia, the free encyclopedia, at least by May 6, 2009, 10 pages.

* cited by examiner

*Primary Examiner*—Henry K Choe
(74) *Attorney, Agent, or Firm*—John F. McCabe

(57) ABSTRACT

An apparatus includes an electronic amplifier and an electrical feedback line, a plurality of electrical sources, and an electronic controller. The electrical feedback line connects an output of the electronic amplifier to an input thereof. The electrical sources connect to nodes on the electronic feedback line. The electronic controller is configured to adjust the electrical sources in a manner responsive to a current input to the electrical feedback line.

17 Claims, 9 Drawing Sheets

TRANSIMPEDANCE AMPLIFIER WITH DISTRIBUTED CONTROL OF FEEDBACK LINE

BACKGROUND

1. Technical Field

The inventions relate to electronic amplifiers and methods of operating electronic amplifiers.

2. Discussion of the Related Art

This section introduces aspects that may be helpful to facilitating a better understanding of the inventions. Accordingly, the statements of this section are to be read in this light and are not to be understood as admissions about what is in the prior art or what is not in the prior art.

FIG. 1 illustrates an exemplary light detection circuit 10 that is based on a differential active transimpedance amplifier (ATIA) 12 and a matched pair of reverse-biased photodiodes 14, 16. The light detection circuit 10 measures differences in intensities of light L1, L2 incident on the two photodiodes 14, 16. In particular, the first and second photodiodes 14, 16 produce respective first and second output currents I1, I2. The magnitude of the first output current I1 and the second output current I2 indicate the intensity of the light L1, L2 incident on the respective first photodiode 14 and the second photodiode 16.

The differential ATIA 12 is a current-to-voltage converter. For that reason, the difference between the voltages at the first and second outputs of the differential ATIA 12 are about proportional to the difference between the currents I1, I2 that are applied to the first and second inputs of the ATIA.

The differential ATIA 12 includes an electronic differential amplifier 18 and first and second electrical feedback lines 20, 22. The inverting electronic differential amplifier 18 may have a high input impedance, a low output impedance, and a high voltage gain, e.g., as an operational amplifier. Each electrical feedback line 20, 22 includes a resistor R. Each electrical feedback line 20, 22 connects one of the outputs 24, 26 of the electronic differential amplifier 18 to a corresponding one of the inputs 28, 30 of the electronic differential amplifier 18 in a voltage-inverting manner. Thus, the electrical feedback lines 20, 22 produce negative feedback that can stabilize the operation of the electronic differential amplifier 18. In addition, the resistors R are passive internal loads that enable the currents input to the ATIA 12 to produce output voltages. For that reason, the ATIA 12 functions as a current-to-voltage converter.

Each photodiode 14, 16 has an output that connects to one of the inputs 28, 30 of the ATIA 12. For that reason, the ATIA 12 can produce two voltages whose difference is indicative of the difference between currents produced by the two photodiodes 14, 16. Since the magnitudes of these currents are also indicative of the intensities of the light L1, L2 received by the photodiodes 14, 16, the difference between the voltages at the two outputs 24, 26 of the electronic differential amplifier 18 can provide a measure of the difference between the intensities of the light L1, L2 received at the two photodiodes 14, 16.

BRIEF SUMMARY

An apparatus includes an electronic differential amplifier and an electrical feedback line, a plurality of electrical sources, and an electronic controller. The electrical feedback line connects an output of the electronic amplifier to an input thereof. The electrical sources connect to nodes on the electronic feedback line. The electronic controller is configured to adjust the electrical sources in a manner responsive to a current input to the electrical feedback line.

In some embodiments of the apparatus, the plurality of electrical sources includes a current source connected to each node. The plurality of electrical sources may include a current sink connected to each node.

In some embodiments of the apparatus, the plurality of electrical sources includes a current sink connected to each node.

In some embodiments of the apparatus, the controller is configured to cause a difference between an input DC voltage of the electronic amplifier and an output DC voltage of the electronic amplifier to evolve to a preset value.

In some embodiments of the apparatus, the controller is configured to cause input DC voltage of the electronic amplifier to evolve to a preset value.

In some embodiments of the apparatus, the electronic controller includes a second electronic amplifier connected to operate the electrical sources, e.g., the current sources and sinks, in a manner responsive to a current input to the electronic feedback line.

In some embodiments, the apparatus includes a photodiode connected to one input of the electronic amplifier.

In some special embodiments, the apparatus includes a second electrical feedback line and a plurality of second electrical sources. The second electrical feedback line connects a second output of the electronic amplifier to a second input thereof. The second electrical sources connect to nodes on the second electronic feedback line. The electronic controller is configured to adjust the second electrical sources in a manner responsive to a current at one of the inputs of the electronic amplifier.

In some such special embodiments, the second electrical sources may include a second current source connected to each second node.

In some such special embodiments, the second electrical sources may include a second current sink connected to each second node.

In some such special embodiments, the electronic controller includes a second electronic amplifier connected to operate the first and second sources in a manner responsive to a current input to the first electronic feedback line.

Some such special embodiments further include an electronic controller configured to compensate for a difference between a magnitude of a current in the first feedback line and a magnitude of a current in the second feedback line.

A method of operating an ATIA includes inputting a current having a DC component to a linear electrical feedback line and adjusting first and second electronic sources.

The linear electrical feedback line connects to an output of an electronic amplifier to an input of the electronic amplifier. The adjusting removes the DC component of the current from a segment of the linear electrical feedback line between the sources in response to the receiving. The sources connect to nodes on the linear electrical feedback line.

In some embodiments, the method further includes operating a set of current sinks or current sources to source or sink said inputted current.

In some embodiments of the method, the adjusting includes generating one or more control voltages for said sources with an electronic amplifier having one input connected to receive a voltage at an input of the electronic amplifier and having a second input connected to receive a reference voltage.

In some such special embodiments of the method, the adjusting further includes biasing a pair of current sources or current sinks to source or sink the DC component such that DC component is removed from the segment.

BRIEF DESCRIPTION OF THE DRAWINGS

In the Figures and text, like reference symbols indicate elements with similar or the same functions and/or structures.

In the Figures, the relative dimensions of some features may be exaggerated to more clearly illustrate one or more of the structures or features therein.

Herein, various embodiments are described more fully by the Figures and the Detailed Description of Illustrative Embodiments. Nevertheless, the inventions may be embodied in various forms and are not limited to the embodiments described in the Figures and Detailed Description of Illustrative Embodiments.

DETAILED DESCRIPTION OF ILLUSTRATIVE EMBODIMENTS

Herein, active transimpedance amplifier (ATIA) refers to an active current-to-voltage converter. ATIAs include an active voltage amplifier, e.g., an operational-amplifier (op-amp), and one or more electrical lines providing negative feedback to the active voltage amplifier.

The operating configuration of an ATIA is usually determined by one or more DC or almost-DC biasing voltages. Here, almost-DC voltages change very slowly, e.g., orders of magnitude more slow than the frequencies over which the ATIA will be operated. The DC and almost-DC voltage(s) at the input(s) and/or output(s) of the ATIA may be such biasing voltage(s). For that reason, DC and almost-DC voltage(s) at input(s) or output(s) of an ATIA may need to be set to and rapidly evolved to value(s) to produce a desired operating configuration of the ATIA.

A device connecting to an input of an ATIA can set or change the DC or almost-DC voltage at the input and/or output of the ATIA. Indeed, such a device may set a DC voltage bias at an input of the ATIA and an output current of such a device may set a DC voltage bias at the output of the ATIA due to a feedback line of the ATIA. In addition, a slow variation in the DC output current and/or voltage of such a device may undesirably change the DC bias at the input and/or output of the ATIA. Such a variation may result from an unexpected change in an environmental condition of such a device.

Figure 1:
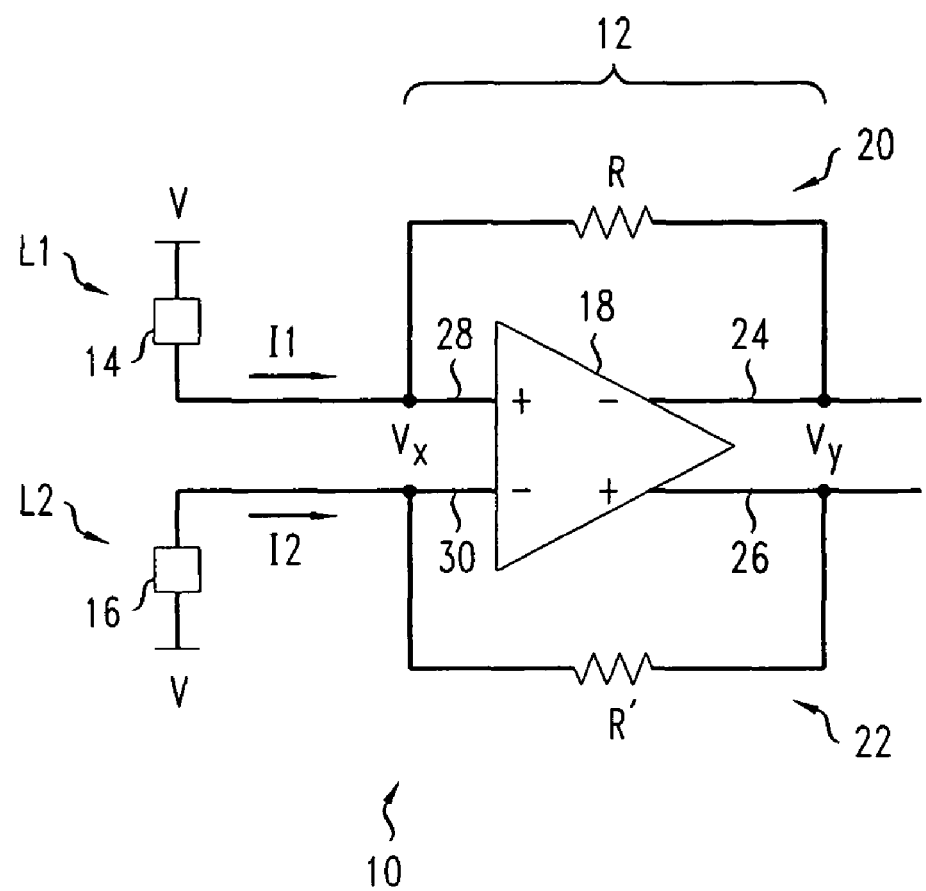
FIG. 1 is a circuit diagram illustrating a configuration in which an active transimpedance amplifier (ATIA) may be used to measure differences in first and second received light intensities.

As an example, the light detection circuit 10 of FIG. 1 may be susceptible to undesirable changes in its operation configuration. In particular, the photodiodes 14, 16 are biased by a DC voltage source V, e.g., so that the photodiodes 14, 16 are reverse biased. The values of the DC output currents I1, I2 of the photodiodes 14, 16 influence the DC biasing at the inputs 28, 30 of the electronic differential amplifier 18, i.e., input common-mode voltage $V_X$. In addition, due to the feedback lines 20, 22, the same DC output currents I1, I2 also influence the DC biasing at the outputs 24, 26 of the electronic differential amplifier 18, i.e., output common-mode voltage $V_Y$. In addition, slow temporal variations in the output currents I1, I2 of the photodiodes 14, 16 can change the DC biasing at the inputs 28, 30 and/or outputs 24, 26 of the electronic differential amplifier 18. Thus, the operating configuration of the ATIA 12 is susceptible to the DC output currents I1, I2 from the photodiodes 14, 16. Indeed, these input characteristics may set the operating point of the ATIA 12 to a configuration with an undesirably low dynamic range and/or an unacceptable linearity. Such problems of appropriately setting the DC biasing configuration are believed to become more severe when large feedback resistors R are used in the ATIA 12 to achieve a low-noise design. For example, such biasing problems may become more severe due to the resulting large differences in the sizes of input and output DC common-mode voltages $V_X$, $V_Y$ in low-noise configurations.

Some of the illustrated embodiments can compensate for different values of constant or slowly varying input currents to produce more desirable input and/or output DC biasing conditions for the electronic differential amplifiers of ATIAs.

Figure 2:
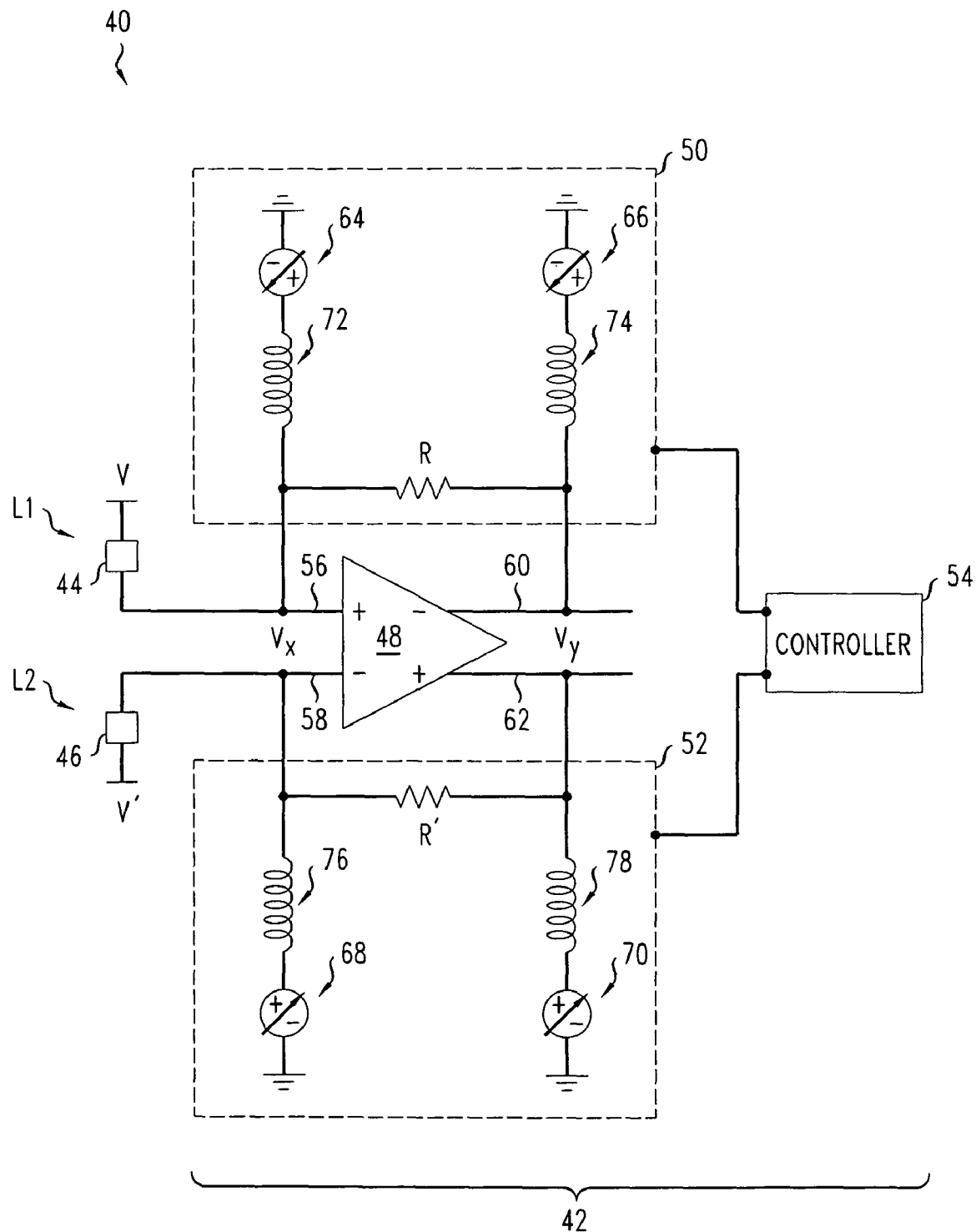
FIG. 2 is a circuit diagram illustrating a configuration in which a first embodiment of an ATIA is driven in a two-ended manner.

FIG. 2 illustrates an embodiment of an electronic circuit 40 that includes an ATIA 42, i.e., an active current-to-voltage converter having an approximate linear response over an operating frequency range. The ATIA 42 is configured to operate in a two-ended configuration, because the ATIA 42 is connected to receive currents from two input devices 44, 46. The ATIA 42 may be configured to output a pair of voltages whose difference is about proportional to a difference between the currents from the input devices 44, 46 over a preselected range of operating frequencies. For example, the input devices 44, 46 may be first and second matched and reverse-biased photodiodes so that the ATIA 42 first and second outputs voltages whose difference is about proportional to the difference between light intensities L1, L2 incident on the first and second photodiodes in the preselected range of operating frequencies. Since the input devices 44, 46 can output various DC currents at various DC biases, generic values of the operating characteristics of the input device 44, 46 may produce an undesirable biasing configuration for an ATIA or may slowly vary to produce such an undesirable biasing configuration. Some embodiments of the ATIA 42 can compensate for relatively generic values of the operating characteristics of the input devices 44, 46 so that the ATIA 42 still has a preselected and desirable operating configuration. Indeed, the ATIA 42 may compensate for differences between the output characteristics of different types of the input devices 44, 46 and/or may temporally stabilize the DC output characteristics of the input devices 44, 46 so that the ATIA 42 remains at a desired operating configuration.

The ATIA 42 includes an electronic differential amplifier 48; upper and lower distributed electrical feedback lines 50, 52; and an electronic controller 54. The electronic differential amplifier 48 has inputs 56, 58 and outputs 60, 62.

The electronic differential amplifier 48 may have, e.g., a high input impedance, a low output impedance, and/or a high voltage gain, wherein said operating characteristics apply from low or DC frequencies up to frequencies at the high-end of the preselected operating range of the ATIA 42. As an example, the electronic differential amplifier 48 function as a conventional operational amplifier over a frequency range from about 0 Hertz to about 1 giga-Hertz or higher.

Each distributed electrical feedback line 50, 52 includes a feedback resistor R, R' that connects one of the outputs 60, 62 of the electronic differential amplifier 48 to the relatively inverted input 56, 58 of the electronic differential amplifier 48. The feedback resistors R, R' may have the about the same resistance or may have different resistances. The upper and lower distributed electrical feedback electrical lines 50, 52 provide negative feedback that may stabilize the operation of the electronic differential amplifier 48. The feedback resistors R, R' are also passive internal loads that enable the ATIA 42 to convert input currents into output voltages and thereby function as an active current-to-voltage converter. In other embodiments, the resistors R, R' may be 2-port devices with more general impedances, wherein the 2-port devices behave as the resistors R, R' at low frequencies.

Each distributed electrical feedback line 50, 52 also includes a pair of variable DC voltage sources 64, 66, 68, 70 that connect to opposite sides of the feedback resistors R, R' thereon via inductors 72, 74, 76, 78. In particular, each inductor/variable DC voltage-source, i.e., pairs (72/64), (74/66), (76/68), and (78/70), forms a variable voltage source at low frequencies and forms a high impedance connection to ground at high frequencies, e.g., at frequencies in the preselected operating range of the ATIA 42.

The pairs (72/64), (74/66), (76/68), and (78/70) are controllable to adjust the DC voltage biases at the inputs 56, 58 and the outputs 60, 62 of the electronic differential amplifier 48. For example, individually adjusting the output voltage of one of the pairs (72/64), (74/66), (76/68), and (78/70) enables the adjustment of the DC bias at the one of the inputs 56, 58 or outputs 60, 62 of the electronic differential amplifier 48 to which the pair is directly connected. In addition, the variable DC voltage sources 64, 66, 68, 70 may be setup to cause, at most, a small effect on feedback via the resistors R and R' at the higher operational frequencies of the ATIA 42, because the variable DC voltage sources 64, 66, 68, 70 connect to the linear electrical feedback lines through R and R' via large impedances at those higher operating frequencies. For example, the inductors 72, 74, 76, 78 may be selected, e.g., to have impedances that are 10 or more times the resistances of the feedback resistors R, R' in the preselected frequency-operating range so that the direct effect of the variable DC voltage sources 64, 66, 68, 70 on feedback via R and R' is small in this frequency range.

The electronic controller 54 operates the variable DC voltage sources 64, 66, 68, 70 to set and/or maintain DC voltage (s) at the input(s) 56, 58 and/or the output(s) 60, 62 of the electronic differential amplifier 48 at preselected and desired values. That is, the electronic controller 54 controls output voltages of the variable DC voltage sources 64, 66, 68, 70 to appropriately set and/or temporally stabilize DC biases of the electronic differential amplifier 48 in the presence of DC currents from the voltage-biased input devices 44, 46. The electronic controller 54 can acceptably set and stabilize the biasing configuration of the electronic differential amplifier 48 in the face of unknown and/or slowly varying DC characteristic(s) of the input devices 44, 46.

To produce such biasing compensation, the electronic controller 54 may effectively measure low frequency or DC voltages at one or both sides of each feedback resistor R, R', e.g., the input and output DC common-mode voltages $V_X$, $V_Y$ may be measured or the difference $V_X-V_Y$ may be measured. The electronic controller 54 adjusts the output voltages of the variable voltage sources 64, 66, 68, 70 to reduce differences between said measured DC voltage(s) and preselected desired values for said DC voltage(s) for a desired biasing configuration of the electronic differential amplifier 48. As a result, the DC operating or biasing point of the ATIA 42 may be suitably initialized and/or temporally stabilized in the presence of an unknown and/or time-varying environment of the output DC current(s) and DC biases of the input devices 44, 46.

Indeed, the biasing compensation may include adjusting the sign(s) and/or the magnitude(s) of the DC or almost-DC currents in the feedback resistors R, R'. The sign of such a DC or almost-DC current may be inverted by adjusting the two variable DC voltage sources 64, 66, 68, 70 of the same distributed electrical feedback line 50, 52 to interchange the relative magnitudes of their output voltages. The magnitude of such a DC or almost-DC current may be increased (decreased) by adjusting the two variable DC voltage sources 64, 66, 68, 70 that connect to opposite sides of the same feedback resistor R, R' by together increasing (decreasing) the magnitude of the ratio of their output voltages.

Since each input device 44, 46 connects to one of the inputs 56, 58 of the electronic differential amplifier 48, the difference between the output voltages of the electronic differential amplifier 48 may be indicative of the difference between the currents from the input devices 44, 46. Thus, at frequencies high enough to ignore the connections to ground through the variable DC-current sources 64, 66, 68, 70, a difference between the voltages at the outputs 60, 62 of the electronic differential amplifier 48 may indicate an about proportional difference between the currents from the input devices 44, 46.

In some embodiments, the input devices 44, 46 are reverse-biased photodiodes so that the magnitudes of their output currents are about proportional to intensities of light L1, L2 incident thereon. Then, the difference between the voltages at the outputs 60, 62 of the ATIA 42 may be good measures of the difference between the light intensities received at such photodiodes in the preselected frequency operating range.

As an example, the ATIA 42 may be part of a coherent optical receiver that is configured to receive and decode an optical carrier modulated to carry QPSK symbols at a symbol rate of 100 mega-Hertz or higher or even at a symbol rate of 1 giga-Hertz or higher. In such an optical receiver, the first and second input devices 44, 46 may be matched and reverse-biased photodiodes that are connected to detect light L1, L2 from the two optical outputs of an optical hybrid. In such an optical receiver, intensity differences between the light L1, L2 received by the matched photodiodes may be indicative of the values of the QPSK symbols that are modulated onto the optical carrier producing said light L1, L2 or the values may be usable to determine such QPSK symbol. Some such coherent optical receivers may include two such optical hybrids so that separate measurements can be made on in-phase and quadrature-phase components of the modulated optical carrier. Each optical hybrid will then, be monitored by a corresponding pair of matched and reverse-biased photodiodes and an associated ATIA. The output voltage differences from the two ATIAs may be further processed to determine the values of the QPSK symbols modulated onto the received optical carrier.

In such optical receivers, the measured intensity differences may be used to extract such QPSK symbol values by combining measurements of such light intensity differences with subsequent digital processing. In such embodiments, the inductors 72, 74, 76, 78 may have high impedances, e.g., at 100 mega-Hertz or at one giga-Hertz. The impedances may be, at least, 10 times the resistances of the feedback resistors R, R' so that ground connections through the variable DC voltage sources 64, 66, 68, 70 do not substantial affect the feedback via resistors R and R' at the symbol modulated frequency of the optical carrier being analyzed.

In some optical receivers, an embodiment of the circuit 40 where the input devices 44, 46 are a pair of matched and reverse-biased photodiodes may be used to measure such differences in light intensities output be an optical hybrid. Some such examples of optical receivers may be formed by replacing the electronic amplifiers described in one or more of U.S. Patent Application Publication No. 20070036555, U.S. Patent Application Publication No. 20070071456, and U.S. Patent Application Publication No. 20080152361 by the ATIA 42 of FIG. 2, the ATIA 42''' of below FIGS. 5A-5C, or the ATIA 42'' of below FIG. 6. The above three U.S. Patent Application Publications are incorporated herein by reference in their entirety.

Figure 3:
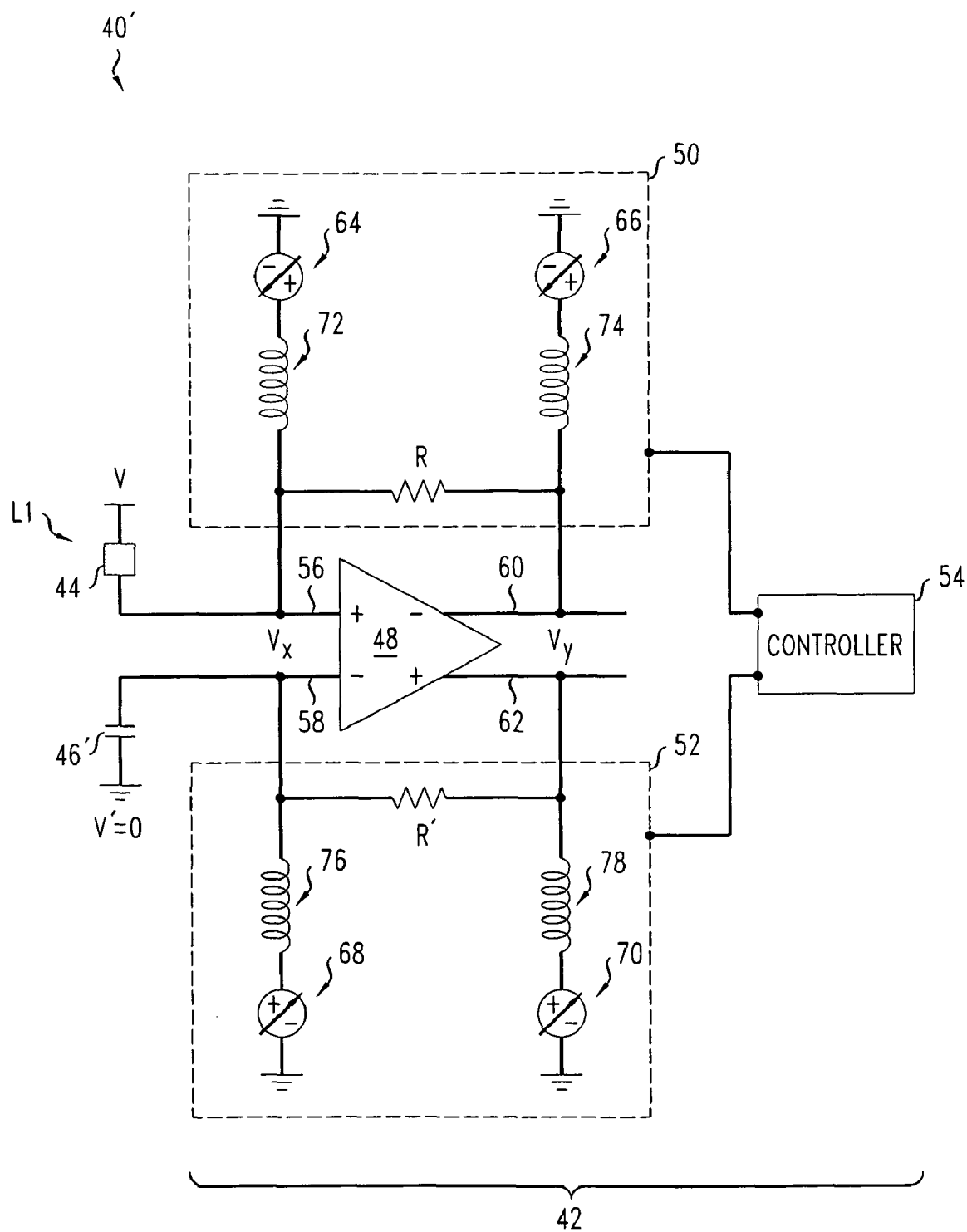
FIG. 3 is a diagram illustrating a configuration in which the ATIA of FIG. 2 is driven in a single-ended manner.
Figure 4:
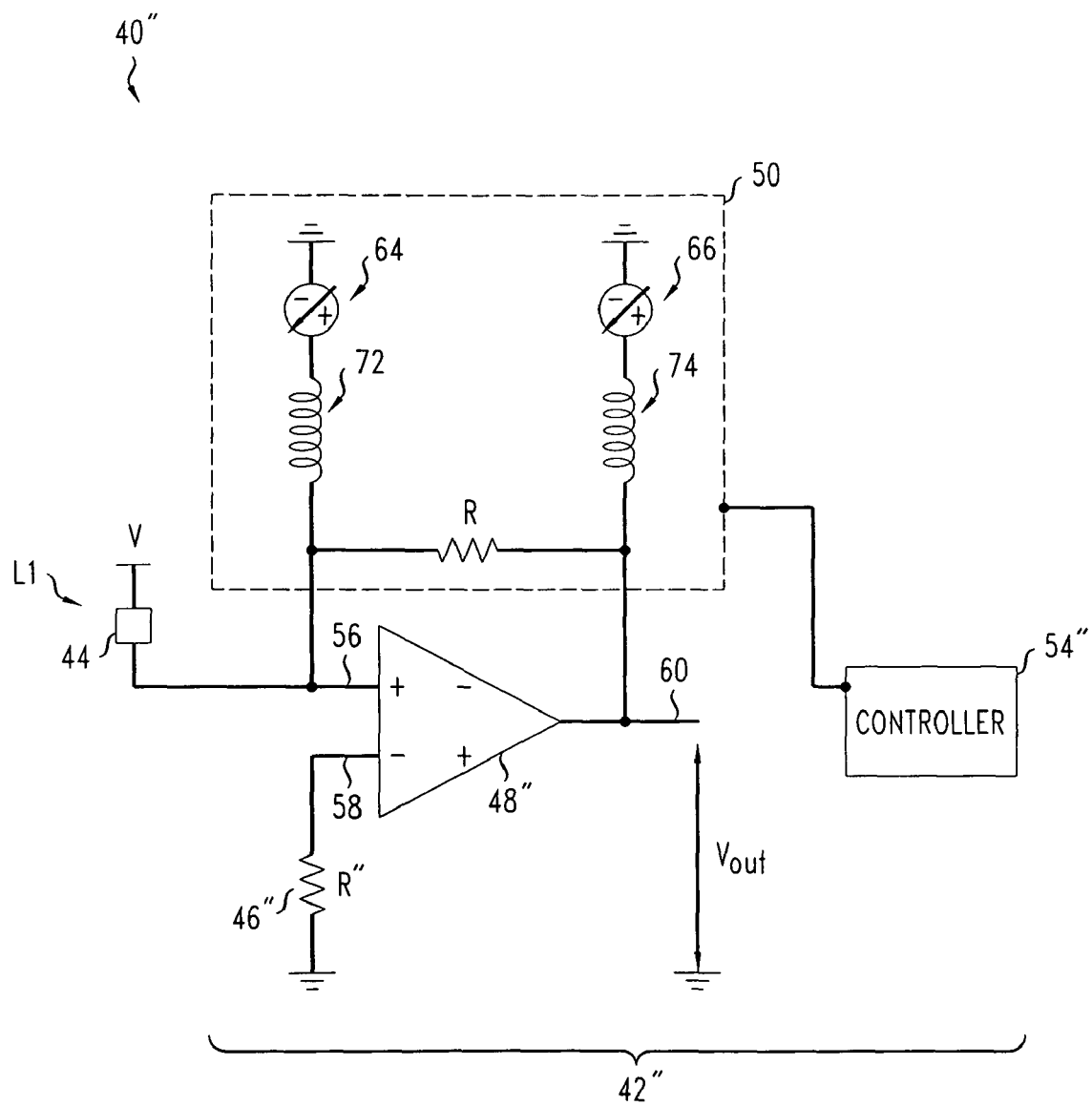
FIG. 4 is a circuit diagram illustrating a configuration that includes an embodiment of a single-output ATIA.

FIGS. 3 and 4 illustrate circuits 40', 40'' in which the same ATIA 42 and another ATIA 42'' are driven in single-ended manners. Some embodiments of these circuits 40', 40'' may also be configured to compensate the DC biasing of the ATIAs 42, 42''.

Referring to FIG. 3, the circuit 40' includes the ATIA 42 and input device 44 as already illustrated in FIG. 2 and new input device 46'. The input device 44 may be, e.g., a photodiode that connects between a bias voltage source V and one input of the ATIA 42 and is configured to receive light L1. The new input device 46' may be a conventional capacitor that connects a common ground to the other input of the ATIA 42 as illustrated or may be another device (not shown).

In the circuit 40', the ATIA 42 includes the same electronic differential amplifier 48, distributed electrical feedback lines 50, 52 and electronic controller 54 as already illustrated in FIG. 2. The electronic controller 54 still controls the upper and lower distributed electrical feedback lines 50, 52 on both sides of the ATIA 42. For that reason, the electronic controller 54 may still setup the ATIA 42 in a suitable biasing configuration and may also still temporally stabilize the ATIA 42 in said biasing configuration. The biasing configuration may be preselected such that the difference between the output voltages of the ATIA 42 is approximately proportional to the intensity of the light L1 received at the photodiode 44 over a preselected operating frequency range.

Referring to FIG. 4, the circuit 40'' includes an ATIA 42'' and the input device 44.

In the circuit 40'', the input device 44 may be, e.g., a reverse-biased photodiode connecting between the bias voltage source V and the upper input 56 of the ATIA 42''. The photodiode is configured to receive light L1.

In the circuit 40'', the input device 46'' is a resistor R'' that connects between a common ground and the lower input 58 of the ATIA 42''.

In the circuit 40'', the ATIA 42'' includes a single-output electronic differential amplifier 48'', upper distributed electrical feedback line 50, and an electronic controller 54''.

The electronic differential amplifier 48'' can be a conventional amplifier, e.g., having a high input impedance, a low output impedance, and/or high voltage gain from a low frequency to an upper desired operating frequency. For example, the electronic differential amplifier 48'' may be a conventional operational amplifier.

The distributed electrical feedback line 50 has a form that has already been described with respect to FIGS. 2-3. The distributed electrical feedback line 50 connects the output of the electronic differential amplifier 48'' to the input 56 of the electronic differential amplifier 48'' that is inverted with respect to the output 60. That is, the feedback line 50 provides for stabilizing negative feedback. The feedback line 50 includes a resistor R that provides the load needed for the ATIA 42'' to function as an active current-to-voltage converter in its desired operating frequency range.

The electronic controller 54'' controls the feedback line 50 of the ATIA 42'' so that the input and output DC or almost-DC bias voltages of the electronic differential amplifier 48'' are setup and/or temporally stabilized at a desired operating configuration. The electronic controller 54'' may effectively measure the DC or almost-DC voltages at the input 56 and output 60 of the electronic differential amplifier 48'' and adjust the variable DC voltage sources 64, 66 to setup and/or maintain preselected input and output DC biases for the electronic differential amplifier 48''. The operation of the electronic controller 54'' with respect to the feedback line 50 would be easily understood by a person of skill in the art from the above-described operation of the electronic controller 54 of FIGS. 2-3. Each electronic controller 54, 54'' uses similar techniques to setup and/or stabilize DC bias(es) for the electronic differential amplifiers 48, 48''. The electronic controller 54'' may setup and/or maintain the biasing configuration of the electronic differential amplifier 48'' such that the output voltage $V_{out}$ of the ATIA 42'' is approximately proportional to the intensity of the light L1 incident on the photodiode 44 in a preselected operating frequency range for the ATIA 42''.

Figure 5A:
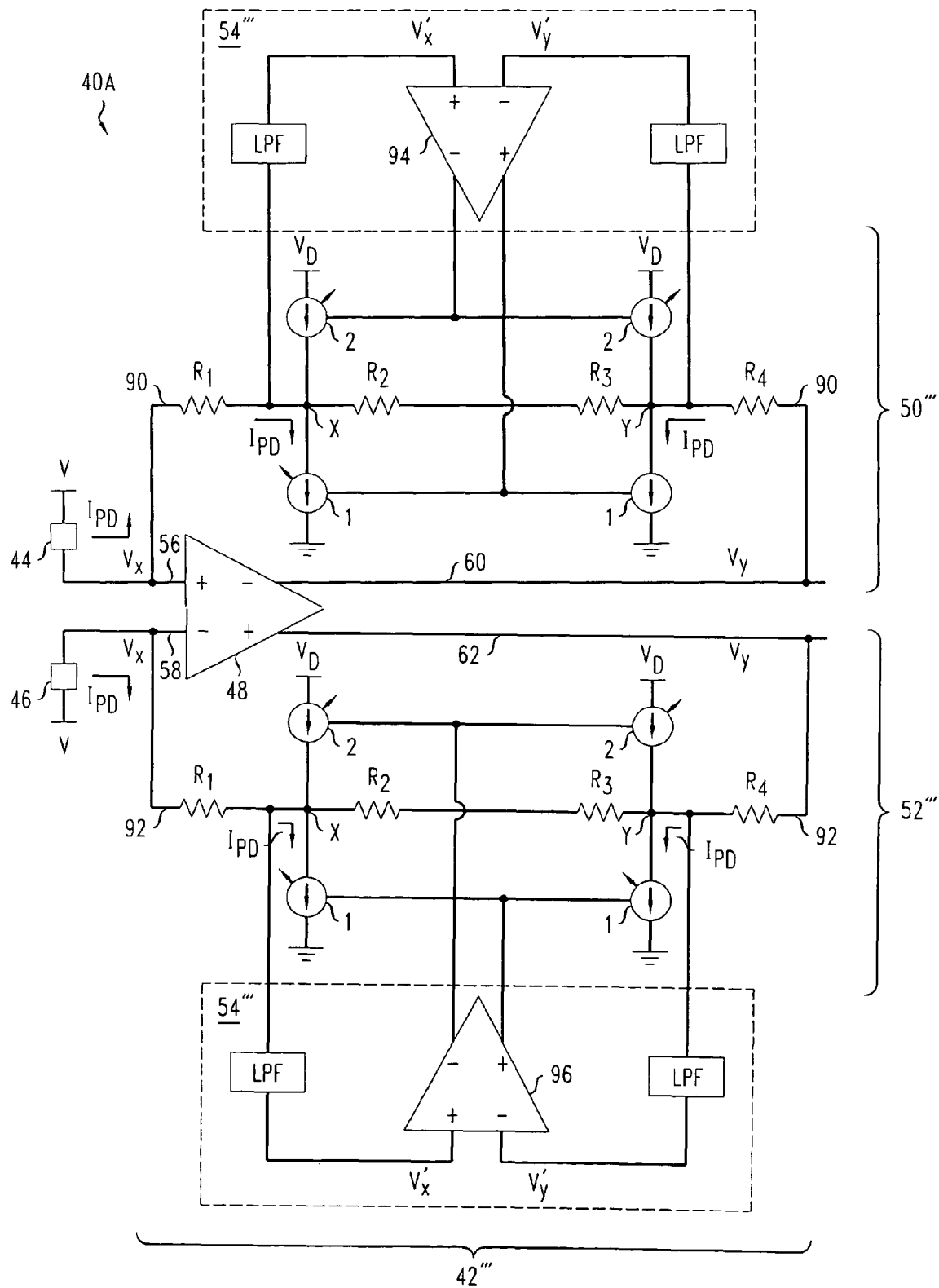
FIGS. 5A-5B are circuit diagrams illustrating configurations in which a third embodiment of an ATIA is driven in two-ended manners.
Figure 5B:
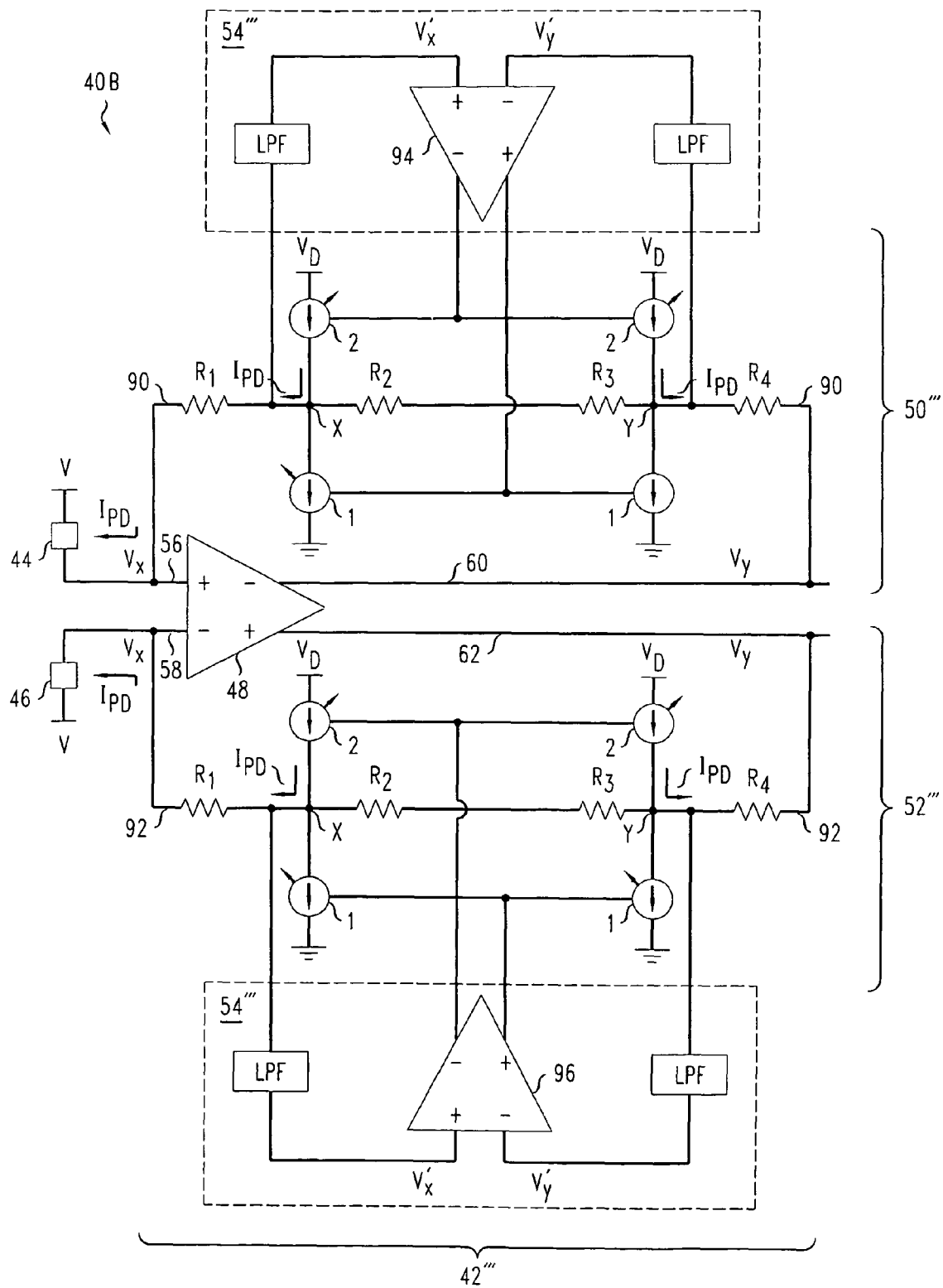
Figure 5C:
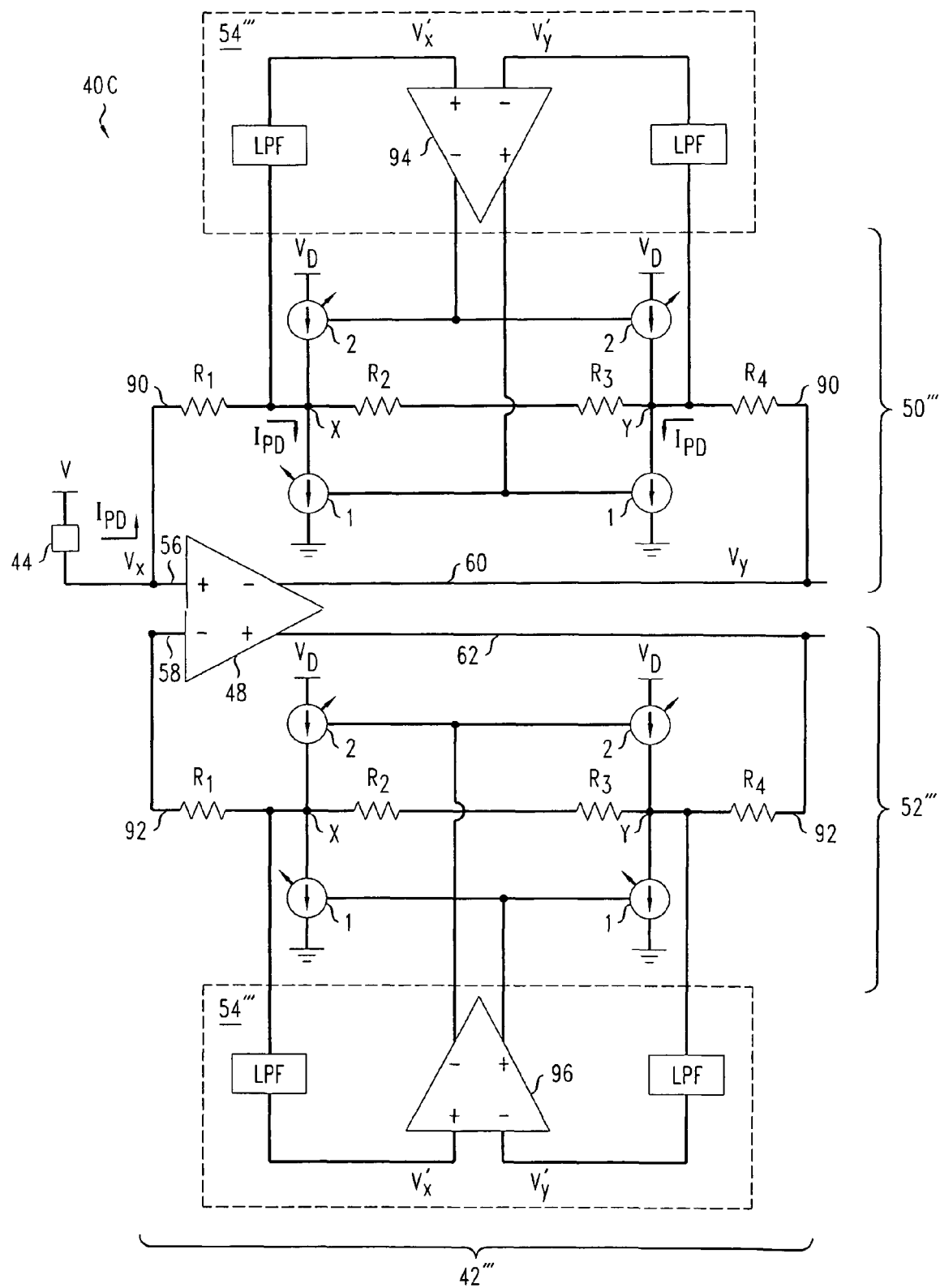
FIG. 5C is a circuit diagram illustrating configurations in which the third embodiment of the ATIA of FIGS. 5A-5B is driven in a single-ended manner.

FIGS. 5A-5C illustrate example stable final states 40A-40C of a third embodiment of an ATIA 42''', wherein the stable final states are produced by driving the ATIA 42''' in various manners. In the configurations 40A-40C of FIGS. 5A-5B, each input device 44, 46 produces the same DC output current in the sable final state, i.e., an output current $+I_{PD}$ in FIG. 5A and an output current $-I_{PD}$ in FIG. 5B. In these circuits, the first and second input devices 44, 46 may be, e.g., similar or identical photodiodes that are similarly or identically reverse biased. In the configuration of FIG. 5C, the single input device 44' produces the DC output current of $+I_{PD}$ in the stable final state.

In FIGS. 5A-5C, the ATIA 42''' includes an electronic differential amplifier 48; upper and lower distributed electrical feedback lines 50''', 52'''; and a controller 54'''.

The electronic differential amplifier 48 may be, e.g., any of the electronic differential amplifiers illustrated in FIGS. 2-3. The electronic amplifier 48 may have a high input impedance, a low output impedance, and/or a high gain, e.g., to function as an operational amplifier from zero frequency to a frequency 100 mega-Hertz or higher or even to 1 giga-Hertz or higher.

The upper (lower) distributed electrical feedback line 50''' (52''') includes upper (lower) linear electrical feedback line 90 (92), a pair of DC current sinks 1, and a pair of DC current sources 2. The upper (lower) linear electrical feedback line 90 (92) connects the upper (lower) output of the electronic differential amplifier 48 to the upper (lower) input of the electronic differential amplifier 48 in a relatively inverted manner.

Each of the upper and lower linear electrical feedback lines 90, 92 is formed by a sequence of three or more serially connected resistors, e.g., resistor R1, resistor R2+R3, and resistor R4. In the sequence, the resistors R1, R4 connect to opposite sides of the central resistor R2+R3, i.e., at nodes X and Y. The resistors R1 and R4 have the same or about the same resistance.

Each pair of DC current sources 2 includes one DC current source 2 that connects to the corresponding upper or lower linear electrical feedback line 90, 92 at the node X and another substantially identical DC current source 2 that connects to the same upper or lower linear electrical feedback line 90, 92 at the node Y. Each pair of DC current sinks 1 includes one DC current sink 1 that connects to the corresponding upper or lower linear electrical feedback line 90, 92 at the node X and another substantially identical DC current sink 1 that connects to the same upper or lower linear electrical feedback line 90, 92 at the node Y. That is, a first DC source-sink pair connects directly to the node X of a linear electrical feedback line 90, 92, and a second DC source-sink pair connects directly to the node Y of the same linear electrical feedback line 90, 92. Each DC current sink 1 may increase its current sinking in response to increase in the applied DC bias and may decrease its current sinking in response to a decrease in the applied DC bias. Similarly, each DC current source 2 may increase its output current in response to an increase in applied DC bias and may decrease its output in response to a decrease in the applied DC bias.

The electronic controller 54''' includes an upper electronic differential amplifier 94 that controls the upper linear electrical feedback line 90 and a lower electronic differential amplifier 96 that controls the lower linear electrical feedback line 92. The upper and lower electronic differential amplifiers 94, 96 may, e.g., have structures and/or configurations that are similar or identical to the structure and/or configuration of the electronic differential amplifier 48. The input of the upper (lower) electronic differential amplifier 94, 96 connects across the nodes X and Y of the upper (lower) feedback lines 90, 92 via low pass filters LPF, e.g., RC circuits or inductors. Thus, the difference $V_Y'-V_X'$ between the DC voltages $V_Y'$, $V_X'$ input to the upper (lower) electronic differential amplifier 94 (96) is proportional to the difference between the DC voltage at the node Y and the DC voltage at the node X in the corresponding upper (lower) linear electrical feedback line 90 (92). The non-inverting output of the upper (lower) electronic differential amplifier 94 (96) connects to a control or bias input of the pair of DC current sinks 1 of the upper (lower) linear electrical feedback line 90 (92). The inverting output of the upper (lower) electronic differential amplifier 94 (96) connects to a control or bias input for the pair of DC current sources 2 for the upper (lower) linear electrical feedback line 90 (92).

The upper and lower portions of the electronic controller 53''' have the same structure. Also, the upper (lower) portion of the electronic controller 54''' controls the DC upper (lower) input and output voltages of the ATIA 42'''. That is, the upper and lower portions of the controller 54''' use the same processes and the same types of elements to cause the respective upper DC biases and lower DC biases of the ATIA 42''' to separately evolve to stable final states.

In the ATIA 42''', the electronic controller 54''' causes the DC biasing of the electronic differential amplifier 48 to evolve to a stable final state. In the stable final state, any initial difference between DC voltages $V_Y$, $V_X$ at the upper input and upper output of the electronic differential amplifier 48 has evolved to zero or to a value close to zero. In the stable final state, any initial difference between the DC voltages $V_Y$, $V_X$ at the lower input and lower output of the electronic differential amplifier 48 has evolved to zero or to a value close to zero. The electronic controller 54''' evolves the DC biasing of the electronic differential amplifier 48 to such a stable final state by imposing final state conditions on the circuit elements of the ATIA 42''' as described below.

First, the upper (lower) portion of the electronic controller 54''' causes the upper (lower) DC current sources 2 and/or upper (lower) DC current sinks 1 to source and/or sink the DC current(s) that flow through the resistors R1 and R4 of the upper (lower) linear electrical feedback line 90 (92). The sourcing and/or sinking is performed so that substantially no current flows through the resistors R2 and R3 in a stable final state. But, in such a stable final state, a very small current may still flow in the resistors R2 and R3 such a small current may be due to the base currents of a few bipolar transistors and/or the gate leakage currents of a few field-effect-transistors. In the stable final state of FIG. 5A, the DC current flowing in the resistor R1 goes to the DC current sink 1 connecting directly to the node X, and the DC current flowing in the resistor R4 goes to the DC current sink 1 directly connected to the node Y. In the stable final state of FIG. 5B, the DC current flowing in the resistor R1 comes from the DC current source 2 connected directly to the node X, and the DC current flowing in the resistor R4 comes from the DC current sink 2 connected directly to the node Y. In the stable final state of FIG. 5C, the upper distributed electrical feedback line 50''' has the same stable final state of FIG. 5A, and the lower distributed electrical feedback line 52''' has a stable final state in which the lower DC current sinks and sources 1, 2 do not substantially sink or source currents.

Second, the electronic controller 54''' causes each DC current source 2 of an upper (a lower) pair to source the same DC current to the upper (lower) linear electrical feedback line 90 (92) and causes the each DC current sink 1 of an upper (lower) pair to sink the same DC current from the upper (lower) linear electrical feedback line 90 (92). As a result, in the upper (lower) linear electrical feedback line 90 (92), the same current flows in the resistor R1 and in the resistor R4. This ensures that the DC voltage drop across the resistor R1 of the upper (lower) linear electrical feedback line 90, 92 is the same as the DC voltage drop across the resistor R4 of the same upper (lower) linear electrical feedback line 90 (92) in a stable final state.

For the above reasons, the upper (lower) portion of the electronic controller 54''' causes the difference between the upper (lower) DC output voltage $V_Y$ and the upper (lower) DC input voltage $V_X$ of the electronic differential amplifier 48 to evolve towards zero. In the linear electrical feedback lines 90, 92, the DC current sinks 1 and the DC current sources 2 will be controlled to evolve the DC biases of the differential amplifier 48 to such a stable state for various magnitudes and signs of the DC currents received at the inputs of the ATIA 42'''.

FIGS. 5A-5C illustrate final states 40A-40C that result from applications of various input currents to the ATIA 42'''. In the absence of applied input currents, the linear electrical feedback lines 90, 92 would carry no currents, and the DC current sinks and sources 1, 2 would not source or sink any substantial DC currents. The application of input current(s) to the ATIA 42''' initially produce(s) voltage(s) across the electronic differential amplifier(s) 94, 96 that cause a subsequent evolution of the DC biasing state of the electronic differential amplifier 48.

In the configuration 40A of FIG. 5A, the input devices 44, 46 apply equal positive input currents, i.e., $+I_{PD}$, to the two inputs of the ATIA 42''' thereby initially causing DC currents $+I_{PD}$ to flow through the linear electrical feedback lines 90, 92. The feedback current $+I_{PD}$ initially causes a voltage drop across the resistor R2+R3 that produces, in turn, a positive initial voltage difference $Vx'-Vy'$ across the inputs of the electronic differential amplifiers 94, 96. In response, the electronic differential amplifiers 94, 96 increased the voltage biases to the DC current sinks 1, which initially sink zero current, and decreases the voltage biases to the DC current sources 2, which initially source zero current. As a result, the DC current sinks 1 sink more current, and the DC current sources 2 do not source or output more current. The electronic differential amplifiers 94, 96 continue to increase voltage biases to the DC current sinks 1 and to decrease voltage biases to the DC current sources 2 until a final state is achieved. In the final state illustrated in FIG. 5A, each DC current sink 1 sinks a current of $I_{PD}$, each DC current source sources zero current, and bias voltages applied to the DC current sinks and sources 1,2 have final stable values.

In the configuration 40B of FIG. 5B, the input devices 44, 46 apply equal negative input currents, i.e., $-I_{PD}$, to the two inputs of the ATIA 43''' initially causing DC currents $-I_{PD}$ to flow through the linear electrical feedback lines 90, 92. The feedback current $-I_{PD}$ causes a voltage drop across the resistor R2+R3 that produces, in turn, a negative initial voltage difference Vx'–Vy' across the inputs of the electronic differential amplifiers 94, 96. In response, the electronic differential amplifiers 94, 96 decrease voltage biases to the DC current sinks 1, which initially sink zero current, and increase voltage biases to the DC current sources 2, which initially source zero current. As a result, the DC current sources 2 output more current, and the DC current sinks 1 do not sink current. The electronic differential amplifiers 94, 96 continue to decrease voltage biases to the DC current sinks 1 and to increase voltage biases to the DC current sources 2 until a final state is achieved. In the final state illustrated in FIG. 5B, each DC current source 2 outputs a current of $-I_{PD}$, each DC current sink 1 sinks zero current, and bias voltages applied to the DC current sinks and sources 1,2 have final stable values.

In the configuration 40C of FIG. 5C, the input device 44 applies a positive input current, i.e., $+I_{PD}$, to the upper inputs of the ATIA 43'', and the lower input of the ATIA 42''' does not receive any input current. Thus, the upper portion of the electronic controller 54''' and the upper distributed feedback line 50''' function as in FIG. 50A to arrive to the final state illustrated therein, and lower portion of the electronic controller 54''' and the lower distributed feedback line 52''' remain in the initial state in which DC input and output currents and DC source and sunk currents remain at their initial values.

Figure 6:
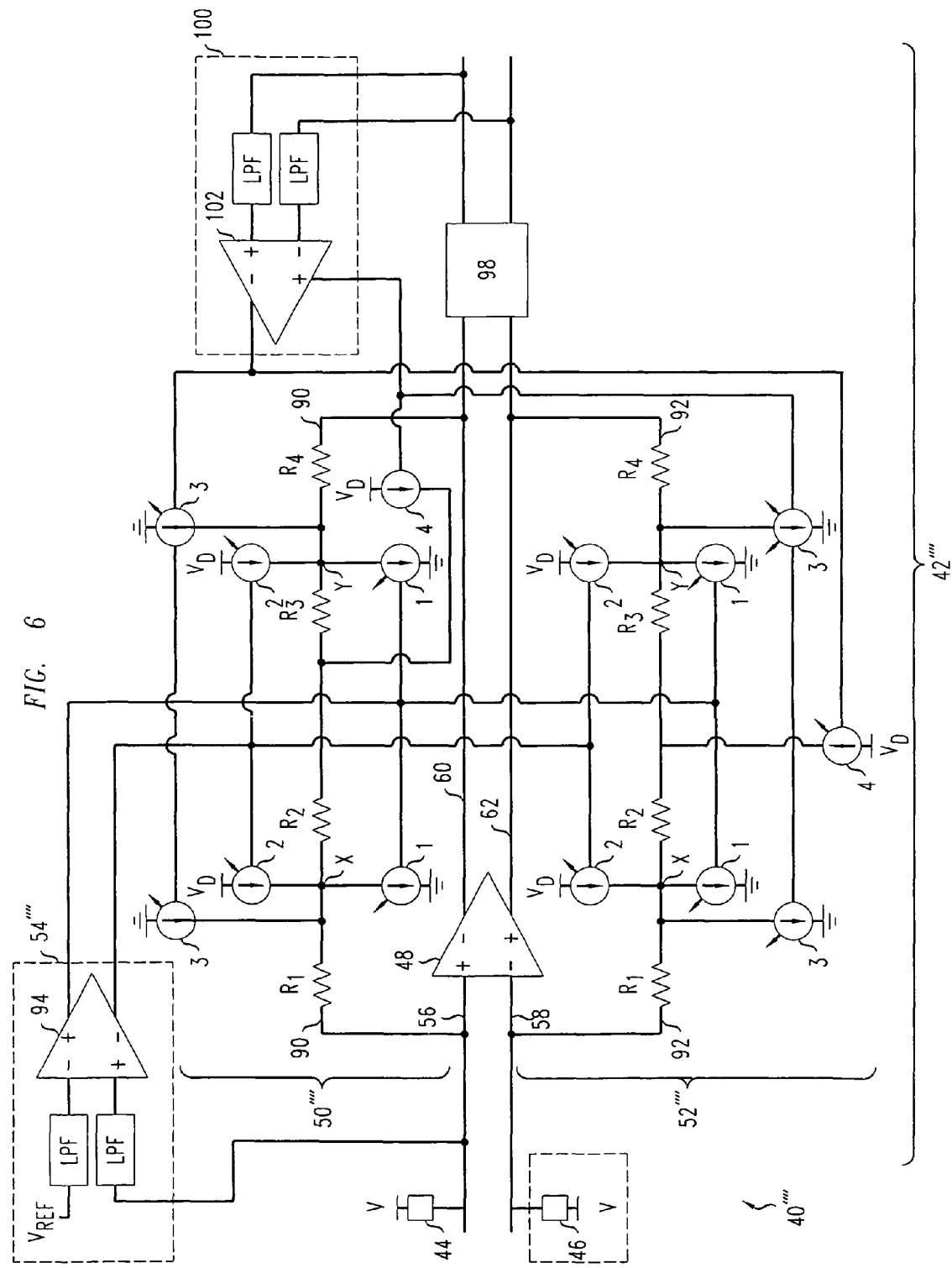
FIG. 6 illustrates circuit diagrams for configurations in which a fourth embodiment of an ATIA may be driven in single-ended or two-ended manners.

FIG. 6 illustrates various driving configurations 40'''' for a fourth embodiment of a ATIA 42''''. The driving configurations 40'''' may be single-ended or double-ended. In particular, some driving configurations include the two input devices 44, 46, and other driving configurations include only the upper input device 44. The third ATIA 42'''' enables control of both DC input voltage(s) and DC output voltage(s).

The ATIA 42'''' includes main electronic differential amplifier 48; upper and lower distributed feedback lines 50'''', 52''''; upper electronic controller 54'''', and electronic offset controller 100, and optionally includes output electronic amplifier or buffer 98.

The main electronic differential amplifier 48 has already been described with respect to FIGS. 2-3 and 5A-5C.

The upper and lower distributed electrical feedback lines 50'''', 52'''' include the linear electrical feedback lines with resistors R1–R4, the DC current sinks 1, and the DC current sources 2 as already described for the upper and lower distributed feedback lines 50''', 52''' of FIGS. 5A-5C. In addition, the upper (lower) distributed feedback lines 50'''', 52'''' include upper (lower) offset DC current sinks 3 and upper (lower) offset DC current sources 4. The offset DC current sinks and sources 3, 4 do not sink or source any substantial DC currents in the initial state where no currents pass through the linear electrical feedback lines 90, 92. The magnitude of the current sunk by an offset DC current sink 3 can increase if the applied control or bias voltage increases and can decrease if the applied control or bias voltage decreases. The current sourced by an offset DC current source 4 can increase for an increased applied control or bias voltage and may decrease for a decreased applied control or bias voltage.

The upper electronic controller 54'''' includes an electronic differential amplifier 94, e.g., an operational amplifier, with low pass filters LPF at its two inputs as already described for the upper portion of the electronic controller 54''' in FIGS. 5A-5C. The low-pass filters LPF can alternately be located at the outputs of the electronic differential amplifier 94 (not shown). The upper electronic controller 54'''' also includes a reference DC voltage source $V_{REF}$ connected to one input thereof. The reference DC voltage source $V_{REF}$ may be, e.g., a fixed conventional voltage source or a partial copy circuit for the ATIA 42''''. The partial copy circuit could be, e.g., the same circuit without the upper electronic controller 54''' and the DC current sources 2 and DC current sinks 1 controlled thereby. In the partial copy circuit, inputs of the ATIA may receive no current so that input DC voltages in the ATIA 42'''' will be equal to the input DC biases in the absence of input currents.

The upper electronic controller 54'''' can control of the input DC voltage biases of the electronic differential amplifier 48. In particular, the first input of the upper electronic controller 54'''' connects to the reference voltage $V_{REF}$, and the second input of the upper electronic controller 54'''' connects to the upper input of the main electronic differential amplifier 48 of the ATIA 42''''. Due to this connection configuration, the upper electronic controller 54'''' can evolve the DC input voltage of the ATIA 42'''' towards the reference voltage $V_{REF}$ as its internal electronic differential amplifier 94 drives the voltage difference between its inputs to zero. That is, the upper electronic controller 54'''' can evolve the DC input voltage(s) of the main electronic differential amplifier 48 of the ATIA 42'''' to any preselected reference DC voltage $V_{REF}$.

The upper electronic controller 54'''' controls both upper and lower distributed feedback lines 50'''', 52'''' in contrast to the separate control of the upper and lower distributed feedback lines 50''', 52''' by the respective upper and lower portions of the electronic controller 54''' in the ATIA 42''' of FIGS. 5A-5B. In particular, the upper electronic controller 54'''' has symmetric connections to the DC current sources 2 and the DC current sinks 1 in the upper and lower distributed electrical feedback lines 50'''', 52''''.

The optional electronic differential amplifier or buffer 98 may provide conventional output isolation to the ATIA 42'''' and/or may provide one or multiple conventional stages of electronic amplification to the ATIA 42''''. Each input of the electronic differential amplifier or buffer 98 connects to a corresponding one of the outputs of the main electronic differential amplifier 48 of the ATIA 42'' thereby providing a two-ended or differential output.

The electronic offset controller 100 includes an electronic differential amplifier 102, e.g., a conventional operational amplifier, and a pair of low-pass filters LPF. One of the low-pass filters LFP connects each input of the electronic differential amplifier 102 to a corresponding one of the differential outputs of the electronic amplifier or buffer 98. One output of the electronic differential amplifier 102 connects to the control or bias input(s) of the offset DC current sink(s) 3 of the upper distributed feedback line 50'''' and connects to the control or bias input(s) of the offset DC current source(s) 4 of the lower distributed feedback line 52''''. The other output of the electronic differential amplifier 102 connects to the control or bias input(s) of the offset DC current source(s) 4 of the upper distributed feedback line 50'''' and connects to the control or bias input(s) of the offset DC current sink(s) 3 of the lower distributed feedback line 52''''. Thus, the electronic differential amplifier 102 drives the offset DC current sinks and sources 3, 4 to sink and source DC feedback currents in opposite manners in the upper and lower distributed feedback lines 50'''', 52''''. Indeed, the electronic offset controller 100 automatically adjusts magnitudes of sourced and sunk DC currents by the offset DC current sink(s) and source(s) 3, 4 until any DC voltage difference for the output voltages of the ATIA 42' tends towards zero.

Thus, the electronic offset controller 100 can automatically set the current levels in the offset DC sinks and sources 3, 4 to compensate for asymmetries between the magnitudes and/or signs of the feedback currents in the upper and lower linear electrical feedback lines 90, 92. Such asymmetries may occur, because the upper electronic controller 54'''' configures the upper and lower DC current sinks and sources 1, 2 in the same manner even though the input devices 44, 46 can output different currents. Such asymmetries may also occur due to offset asymmetries in the double-ended behaviors of the main electronic differential amplifier 48 and/or in the optional electronic differential amplifier or buffer 98.

While FIGS. 5A-5C illustrated embodiments in which the stable final values of the DC output voltages equal stable final values of the DC input voltages, a person of ordinary skill in the art would be readily able to produce alternate ATIAs in which said stable final values of the DC bias voltages differ based on the disclosure herein. For example, such alternate ATIAs might be fabricated by adding parallel fixed or constant DC current sink(s) and/or fixed or constant DC current source(s) to one DC current sink 1 of each pair thereof and to one DC current source 2 of each pair thereof in the ATIA 42'''. In particular, such fixed DC current sinks and sources might enable the construction of such an alternate ATIA having substantial the structure of the ATIA 42''' as shown in FIGS. 5A-5B, except that it has a stable output DC voltage $V_Y$ that differs from its stable input DC voltage $V_X$.

One of skill in the art would also understand that similar modifications could be made to the ATIA 42'''' of FIG. 6 to enable stable final states in which the DC components of $V_X$ and $V_Y$ differ by preselected amounts.

Figure 7:
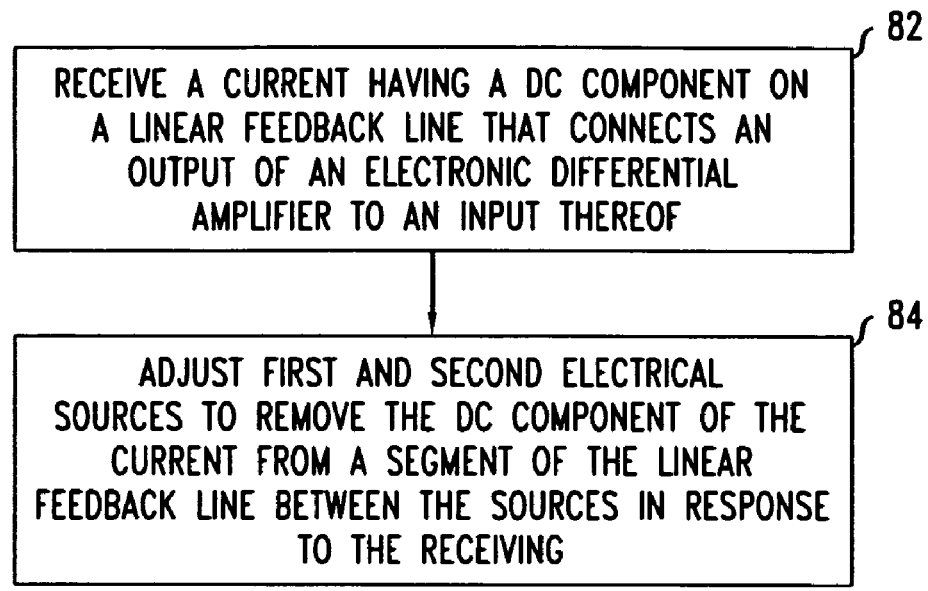
FIG. 7 is a flow chart illustrating a method of operating ATIAs, e.g., the ATIAs as shown in any of FIGS. 2-4, 5A-5C, and 6.

FIG. 7 illustrates a method 80 of operating an ATIA, which implements dynamic control of voltage biasing. The method 80 may be performed to operate the ATIAs 42, 42'', 42''', 42'''' illustrated in FIGS. 2-4, 5A-5C, and 6 as discussed above. The ATIA has an electronic amplifier, e.g., the main electronic differential amplifier 48 of FIGS. 2-3, 5A-5C, and 6 or the non-differential electronic amplifier 48'' of FIG. 4, and one or more linear electrical feedback lines, e.g., the linear electrical feedback lines of FIGS. 2-7, that connect an output of the electronic amplifier to an input thereof.

The method 80 includes inputting a current having a DC component to a linear electrical feedback line (step 82). The linear electrical feedback line connects an output of an electronic amplifier to an input of the electronic amplifier in an inverted manner.

The method includes adjusting first and second electrical sources to substantially remove the DC component of the current from a segment of the linear electrical feedback line between the sources in response to the receiving step 82 (step 84). The removing step 84 may include operating a set of DC current sinks or DC current sources to source or sink said DC component of the input current at nodes on the linear electrical feedback line. In some embodiments, the operating step may include generating one or more control voltages for said sources with an electronic amplifier having one input connected to receive a voltage at an input of the electronic amplifier and having a second input connected to receive a reference voltage. The adjusting step may further include biasing a pair of DC current sources and/or DC current sinks to source or sink the DC component such that DC component is substantially absent on the segment.

If the ATIA is configured for two-ended driving, the method 80 may include adjusting another set of electrical sources, e.g., the variable DC voltage sources 68, 70 of FIGS. 2-3 or the DC current sources 2 and/or DC current sinks of FIGS. 5A-5C and 6.

From the disclosure, drawings, and claims, other embodiments of the invention will be apparent to those skilled in the art.

What is claimed is:

1. An apparatus, comprising:
   an electronic amplifier;
   an electrical feedback line connecting an output of the electronic amplifier to an input of the electronic amplifier;
   a plurality of electrical sources connected to nodes on the electronic feedback line; and
   an electronic controller configured to adjust the electrical sources in a manner responsive to a current input to the electrical feedback line.

2. The apparatus of claim 1, wherein the plurality of electrical sources includes a current source connected to each node.

3. The apparatus of claim 2, wherein the plurality of electrical sources includes a current sink connected to each node.

4. The apparatus of claim 1, wherein the plurality of electrical sources include a current sink connected to each node.

5. The apparatus of claim 1, wherein the controller is configured to cause a difference to evolve to a preset value, the difference being a DC voltage at an input of the electronic amplifier minus a DC voltage at an output of the electronic amplifier.

6. The apparatus of claim 1, wherein the controller is configured to cause input DC voltage of the electronic amplifier to evolve to a preset value.

7. The apparatus of claim 1, wherein the electronic controller includes a second electronic amplifier connected to operate the current sources and sinks in a manner responsive to a current input to the electronic feedback line.

8. The apparatus of claim 1, further comprising a photodiode connected to one input of the amplifier.

9. The apparatus of claim 1, further comprising:
   a second electrical feedback line connecting a second output of the electronic amplifier to a second input of the amplifier and having one or more second resistors thereon;
   a plurality of second electrical sources connected to nodes on the second electronic feedback line; and
   wherein the electronic controller is configured to adjust the second electrical sources in a manner responsive to input to one of the electrical feedback lines.

10. The apparatus of claim 9, wherein the plurality of second electrical sources includes a second current source connected to each second node on the second electrical feedback line.

11. The apparatus of claim 9, wherein the plurality of second electrical sources includes a second current sink connected to each second node on the second electrical feedback line.

12. The apparatus of claim 9, wherein the electronic controller includes a second electronic amplifier connected to operate the first and second electrical sources in a manner responsive to a current input to the first electronic feedback line.

13. The apparatus of claim 9, further comprising an electronic controller configured to compensate for a difference between a magnitude of a current in the first feedback line and a magnitude of a current in the second feedback line.

14. A method of operating an ATIA, comprising:
inputting a current having a DC component to a linear electrical feedback line, the linear electrical feedback line connecting to an output of an electronic amplifier to an input of the electronic amplifier; and
adjusting first and second electronic sources to remove the DC component of the current from a segment of the linear electrical feedback line between the sources in response to the receiving, the sources connecting nodes on the linear electrical feedback line.

15. The method of claim 14, further comprising operating a set of current sinks or current sources to source or sink said inputted current.

16. The method of claim 14, wherein the adjusting includes generating one or more control voltages for said sources with an electronic amplifier having one input connected to receive a voltage at an input of the electronic amplifier and having a second input connected to receive a reference voltage.

17. The method of claim 14, wherein the adjusting further comprises biasing a pair of current sources or current sinks to source or sink the DC component such that DC component is removed from the segment.

* * * * *